US006807650B2

(12) United States Patent
Lamb et al.

(10) Patent No.: US 6,807,650 B2
(45) Date of Patent: Oct. 19, 2004

(54) DDR-II DRIVER IMPEDANCE ADJUSTMENT CONTROL ALGORITHM AND INTERFACE CIRCUITS

(75) Inventors: Kirk D. Lamb, Kingston, NY (US); Dustin J. VanStee, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 198 days.

(21) Appl. No.: 10/161,377

(22) Filed: Jun. 3, 2002

(65) Prior Publication Data

US 2003/0223303 A1 Dec. 4, 2003

(51) Int. Cl.[7] ............................. G06F 17/50; G11C 8/00
(52) U.S. Cl. ....................................... 716/1; 365/230.06
(58) Field of Search .................. 716/1, 2, 5; 365/230.06

(56) References Cited

U.S. PATENT DOCUMENTS 5,909,701 A * 6/1999 Jeddeloh ...................... 711/167
6,515,917 B2 * 2/2003 Lamb et al. ............. 365/189.09

OTHER PUBLICATIONS

Pham et al., "Design, Modeling and Simulation Methodology for Source Synchronous DDR Memory Subsystems," 2000 Electronic Components and Technology Conference, pp. 267–271.*

* cited by examiner

Primary Examiner—Leigh M. Garbowski
(74) Attorney, Agent, or Firm—Lynn L. Augspurger

(57) ABSTRACT

A memory interface device uses a driver impedance adjustment engine with state machine for off chip driver (OCD) calibration which is used to set the driver voltage levels of the DRAM memory module or DIMM of the JEDEC DDR-II standard type. By adjusting the pull-up drive strength and pull-down drive strength, the output voltage levels and the rise times can be optimized to find the minimal signal swing that is still immune to noise, while not degrading the data eye significantly. The state machine finds the optimal setting for the DRAM Driver Impedance, using both DC and AC methods adjusting the value of the driver impedance through a master ASIC, and then sampling the known value sent back from the DRAM. The state machine will stop when the optimal value of the driver impedance is found and automates the process of detecting the optimal driver impedance and configuring the DRAM module or DIMM accordingly. The ASIC circuit and method use a data strobe, not only as strobe, but as data input during OCD calibration. Optimal driver impedance setting of a DDR-II DRAM is detected in a DC mode. Using AC-BIST the optimal driver impedance setting can be adjusted and optimized to account for AC timing influences such as coupled noise, data dependent jitter, and intersymbol interference.

9 Claims, 4 Drawing Sheets

DDR-II DRIVER IMPEDANCE ADJUSTMENT CONTROL ALGORITHM AND INTERFACE CIRCUITS

FIELD OF THE INVENTION

The present invention relates to computer systems and particularly to the utilization of DDR-II memory with memory interface ASICS for memory subsystem calibration control.

TRADEMARKS AND NAMES

IBM® is a registered trademarks of International Business Machines Corporation, Armonk, N.Y., U.S.A. Other names may be registered trademarks or product names of International Business Machines Corporation or other companies. JEDEC is the leading developer of standards for the solid-state industry. JEDEC is part of the Electronic Industries Alliance (EIA), that represents manufacturers in all areas of the electronics industry. JEDEC members create standards working together in many committees. Representatives of member-companies, actively participate on these Committees, developing standards to meet the needs of every segment of the industry and their customers. All JEDEC standards are available online at www.jedec.org. While IBM is an active participant in JEDEC committees, the embodiments of the invention described herein makes use of products manufactured according to JEDEC standards but the embodiments of the invention are not known to be or considered to be relevant to the work on any formulating committee.

GLOSSARY OF TERMS

Data Eye: A graph that plots voltage transitions versus time at a receiver, or multiple receivers. The eye diagram is used to determine the amount of margin a signal or bus has at the receiver. As a signal swings from low to high to low, and high to low to high a characteristic eye is formed at the receiver. The valid data eye is the time that it is valid to sample data at the receiver. Jitter, noise, skew across data bits, etc. will cause the eye to shrink in size.

DIA: A driver impedance adjustment state machine implementing our driver impedance adjustment.

DDR-I: Stands for Double Data Rate DRAM (DDR SDRAM) and is often referenced as DDR and is the subject of a JEDEC standard. This device transmits and receives data at the DRAM on both rising and falling edges of the clock. The clocking mechanism is a separate data strobe signal that is used to sample the data at the DRAM, and it is driven when the DRAM is sending data out to a system.

DDR-II: This is the next generation DRAM (DDR-II SDRAM) after DDR-I and DDR-II is also the subject of a JEDEC standard. DDR-II supports the double data rate features of DDR-I while adding new features. The additional features are the Posted CAS function, off chip driver (OCD) calibration, and on die termination (ODT). These extra parameters improve signal integrity and command bus utilization.

MID: As used here the Acronym refers to a memory interface device. This is a generic DRAM controller that is used to send commands to the DRAM, and it will drive and receive data from the DRAM. DRAM controllers for such purposes have been manufactured before by other companies, such as Intel Corporation for connecting a specific processor. The Intel® 82845 Memory Controller Hub (MCH) is designed for use with the Intel® Pentium® 4 processor in the 478-pin package. The Intel® 845 chipset contains two main components: the Intel 82845 Memory Controller Hub (MCH) for the host bridge and the Intel 82801BA I/O Controller Hub (ICH2) for the I/O subsystem. The MCH provides the processor interface, system memory interface, AGP interface, and hub interface in an 845 chipset desktop platform. The MCH memory interface can be for use with DDR memory.

OCD: refers to the off chip driver of our preferred embodiment.

Optimal Impedance Setting: The optimal DC setting for the driver impedance of the DRAM is determined to be the settings for which the signal swing of the DRAM driver is minimal, and yet still goes beyond the switching threshold of the MID receiver.

Rank: A term used to refer to the set of DRAM devices that is accessed during a single memory transfer. The number of devices accessed is equal to the size of the data bus divided by the device width of the DRAM. A single chip select line is common for all the devices in a single rank.

Valid Impedance Setting: A valid setting for the driver impedance of the DRAM is any setting that the MID is able to detect all zeros during a pull-down test, and all ones during a pull-up test at the receiver. Upon exit of the algorithm, the state machine will converge on to one of three different options, and set the exit status. Refer to Table 1.

Voh: Driver voltage output high

Vol: Driver voltage output low

Vih: Receiver voltage input high

Vil: Receiver voltage input low

VREF: Voltage reference on a differential receiver. As the input voltage rises above VREF, the output switches from a '0' to a '1'. As the input voltage falls below VREF, the output switches from a '1' to a '0'. VREF is usually set to half the DRAM driver voltage.

VREF+: Voltage Reference that is higher than VREF. In this application, VREF+ should be set to the voltage level equal to the preferred voltage output high (Voh) of the DRAM driver. Shown in FIG. 3.

VREF−: Voltage Reference that is lower than VREF. In this application, VREF− should be set to the voltage level equal to the preferred voltage output low (Vol) of the DRAM driver. Shown in FIG. 3.

TABLES

TABLE 1

Algorithm Exit Status

| Optimal Setting | Valid Setting | Exit Status |
|---|---|---|
| 0 | 0 | Test Failed, no valid setting found for any driver impedance value. |
| 0 | 1 | Valid setting was found for every driver impedance setting. No optimal setting found. Driver impedance set at highest levels. |
| 1 | 1 | An optimal setting was found. Test found a pass to fail transition. Driver Impedance set to last known passing setting. |
| 1 | 0 | Not Used |

BACKGROUND

The new DDR-II DRAM devices now manufactured by JEDEC member companies according to the JEDEC DDR-II standard have been designed such that the output driver impedance of the data bits and data strobes are adjustable for both the pull-up resistance to VDD and pull-down resistance to ground. The JEDEC standards describe how the DRAM must work. However, we are unaware of any JEDEC committee that is defining how the interface ASIC must be designed in order to perform the adjustment for off chip driver OCD calibration. It would be desirable to create a memory interface that would be suitable for use as a generic memory interface device or memory interface ASIC for use with the JEDEC DDR-II standard DRAM as represented, particularly one such as a Samsung® DDR-II DRAM memory module DIMM, for example, which could be used with a variety of processors. The introduction of the DDR-II DRAM introduced new problems for which there has been no solution. For instance, there were no chip testers which worked with the new DRAM and any memory interface useful for a variety of processors that performed adequate tests. Indeed how was a memory interface with a DDR-II DRAM to be tested? We found that DC testing didn't account for noise in AC. The data strobe receiver circuit of the DDR-I memory previously was only required to function as a clock output or input and the data strobe for DDR-II does not perform its traditional function. There are two new problems have been introduced: the data strobes must be latched as data, and the data that used to be clocked by these strobes cannot not be so clocked we found. The development of a memory interface ASIC led to many improvements which are detailed herein.

SUMMARY OF THE INVENTIONS

We have provided a memory interface ASIC, and in accordance with the preferred embodiment our off chip driver (OCD) calibration is used by our generic memory interface device to set the driver impedance levels of the DRAM of the JEDEC DDR-II standard type. By adjusting the pull-up drive strength and pull-down drive strength, the output voltage levels and the rise times can be optimized to find the minimal signal swing that is still immune to noise, while not degrading the data eye too severely. We have designed a state machine for the DDR-II off chip driver (OCD) controls that finds the optimal setting for the DRAM Driver Impedance, using both DC and AC methods. The state machine which we developed in accordance with our invention uses an algorithm setting up a procedure for execution with said state machine which selects the optimal impedance settings for the pull-up and pull-down impedance in the DRAM device when it is connected to a memory interface device (MID). Our driver impedance adjustment (DIA) algorithm solves the problem of finding the optimal driver impedance setting by adjusting the value of the driver impedance through a master ASIC, and then sampling the known value sent back from the DRAM. The state machine will stop when the optimal value of the driver impedance is found. The process of the procedure or algorithm has been implemented in the finite state machine we developed and used to automate the process of detecting the optimal driver impedance, and configuring the DRAM module accordingly.

In accordance with the preferred embodiment of our invention we have provided a process implementing a procedure or algorithm in a driver impedance adjustment state machine for both DC and AC modes of operation, and data receiver circuitry used for testing the functionality of DDR-II DRAM off chip driver (OCD) controls.

In DC mode, the driver impedance adjustment (DIA) algorithm solves the problem of finding the optimal driver impedance setting by adjusting the value of the driver impedance through a MID, and then sampling the known value sent back from the DRAM. The state machine will stop when the optimal value of the driver impedance is found. The state machine is used to automate the process of setting the optimal driver impedance in the DRAM module. In accordance with the preferred embodiment of the invention, the optimal driver impedance setting takes into account AC characteristics of the DRAM, therefore ensuring the setting of the driver impedance will work during normal AC operation.

In AC mode, the driver impedance is adjusted to select the optimal setting for the smallest signal swing that still yields a valid data eye. After DC calibration, the output levels of the DRAM driver are set to the lowest pull-up setting that passes, and the highest pull-down setting that passes. This effectively minimizes the switching voltage for the DRAM driver. The AC calibration will check at this setting if the DRAM driver levels are sufficient to support switching reflections and noise that is introduced during real-time operation. This test is done using a combination of the driver impedance adjustments, and running the memory card built in self test (ACBIST).

Prior to DDR-II, the data strobe receiver circuit was only required to function as a clock input. To support the DIA algorithm and OCD DRAM capability of the DDR-II module, the data strobe circuitry was modified to also behave in a mode where it was a data receiver input, therefore requiring the extra circuits to add this special feature to the data strobe circuitry. We added an extra sampling L1/L2 latch at the output of the IO circuit for use with data/data strobe sampling. The problem introduced by the DDR-II product is that during DIA, the data strobe does not perform its traditional function. There are two new problems introduced: the data strobes must be latched as data, and the data that used to be clocked by these strobes must now be clocked in a different manner. We provided a detection circuit to determine if the driver impedance setting is valid. If the setting for the driver impedance is not correct, data will not be transmitted properly between the DDR-II DRAM module and the MID. For testability we have added boundary scan test circuitry at the IO's. In this implementation of a preferred embodiment a boundary scan receiver latch is used to sample the logic value detected at the IO. This implementation will work for both the data and data strobe pins because each IO has a boundary scan structure required for testability. The boundary scan receiver latch uses a muxed internal core clock to sample the data, rather than its standard test clock. If the setting for the driver impedance is not correct, data will not be transmitted properly between the DDR-II DRAM module and the ASIC that interfaces to it. The detection circuit will identify the validity of a driver impedance adjustment (DIA) setting. If the DRAM is in pull-up mode, then the DRAM module will drive back all '1's when queried. If the ASIC receiver does not detect all '1's at the IO device, the detection circuit will register a fail. The pull-down case is the same as the pull-up, except that the DRAM will drive back all '0's when queried and the detection circuit will register a fail if there is not all logic '0's at the IO circuits. The detection circuit solves the problem of knowing whether or not a valid setting is being used.

These and other improvements are set forth in the following detailed description. For a better understanding of the invention with advantages and features, refer to the description and to the drawings.

Our detailed description explains the preferred embodiments of our invention, together with advantages and features, by way of example with reference to the drawings.

DETAILED DESCRIPTION OF THE INVENTION

Here is a discussion of the algorithm, and the circuits involved that perform the driver impedance adjustment.

First, the new driver impedance function in the DDR-II DRAM device must be outlined. To adjust or reset the driver impedance of the DRAM, and extended mode register set (EMRS) command must be sent to the DRAM with a special data pattern that is decoded by the DRAM to determine what action to take. The DRAM provides the capability to reset, increment and decrement driver impedance for both the pull-up and pull-down modes. The EMRS command is used to send the align command to the DRAM. The align command causes the DRAM to drive the data bus with all ones (DRAM Voh) in pull-up mode, and all zeros (DRAM Vol) in pull-down mode. This is used by the receiving MID to determine the valid setting of the DRAM.

Figure 1:
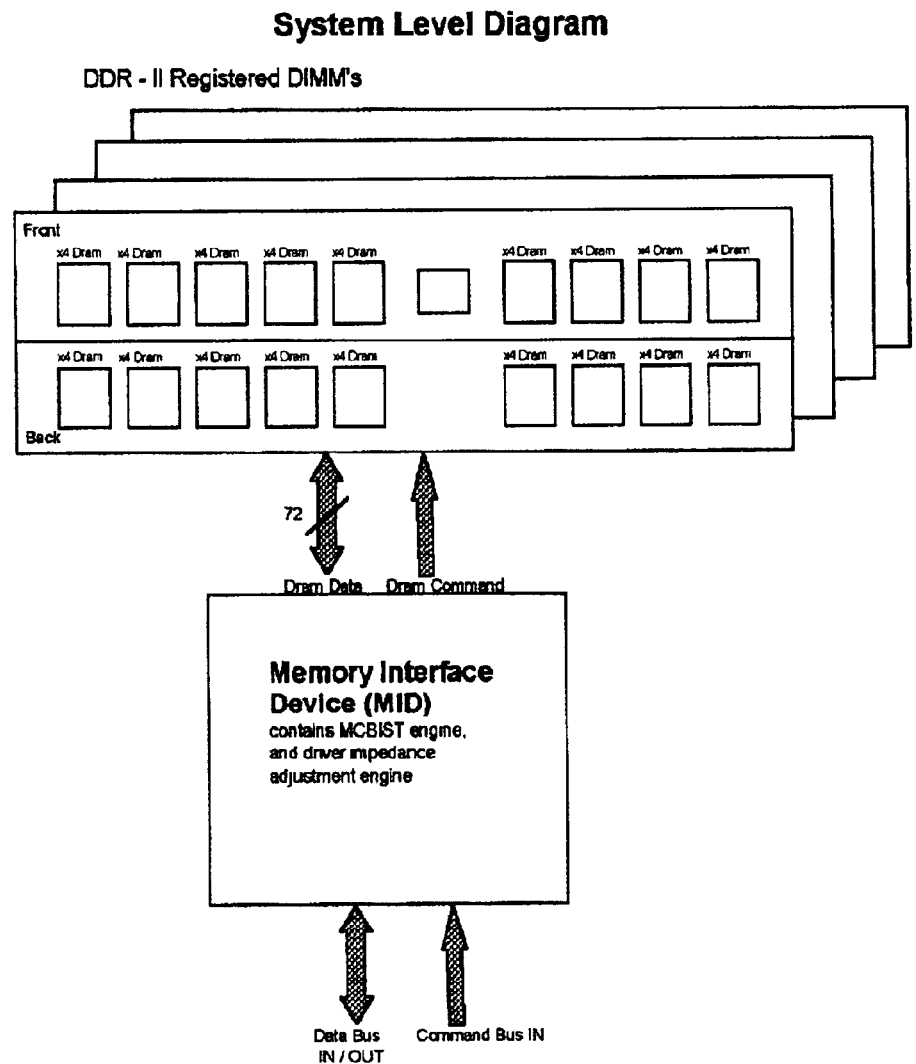
FIG. 1 illustrates the system level implementation of the DDR-II modules with a MID. Although the drawing shows x4 DRAM devices and a 72 bit data bus in a 4 DIMM configuration, this invention can be applied to all DRAM device types (x4, x8, etc.), of any bus width, of any DIMM configuration.

At the system level, as shown in FIG. 1, there is a MID, that will interface to a DIMM of DDR-II devices. Between the DRAM and MID, there is a command and data bus. The command bus will be used to send the EMRS commands and other DRAM commands from the MID to the DRAM. The data bus will be used by the MID to send data during adjust commands, and to receive data during the align commands. In the system, the preferred embodiment is to configure each DRAM device independently in a multi-DIMM configuration. Each DRAM device will have a state machine in the MID that controls the driver impedance adjustment. Each of these slave state machines will report the algorithm exit status bits (Table 1) to the master state machine for each DRAM.

Figure 2:
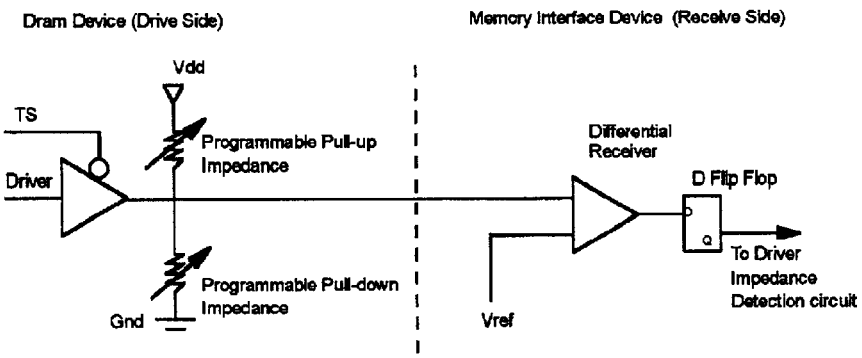
FIG. 2 illustrates the schematic view of a single data/data strobe driver and the receiver on the MID.
Figure 3:
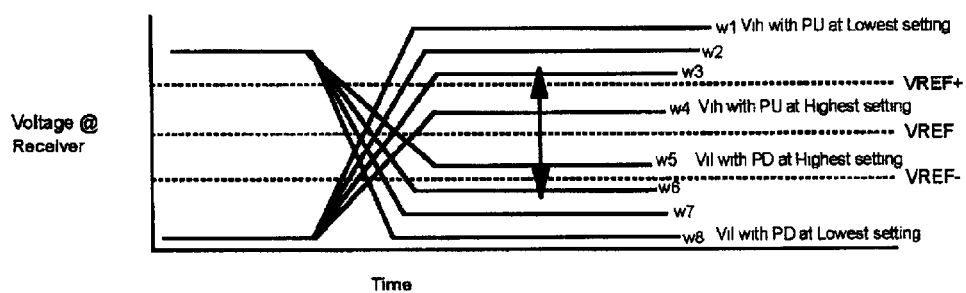
FIG. 3 illustrates the changes in the data eye that result from changing the driver impedance.

At the system level, the only DRAM to MID communication is used during an align command. During an align command the DRAM will drive the bus to all ones in pull-up mode, or all zeros in pull down mode. FIG. 2 shows a schematic representation of the DRAM driver to MID receiver. It is important to note for this test, the VREF at the receiver is set to VREF+ during the pull-up test and VREF− during the pull-down test as shown in FIG. 3. During a pull-up test the DRAM will set the pull-up to the different values of driver impedance, and at the receiver, if the Voh of the DRAM driver does not get above the VREF+ setting, the receiver will sample a zero. The opposite will happen for pull-down. If the DRAM driver does not drive low enough past VREF−, the receiver will register a one.

By finding this point, the data eye region is optimized in terms of minimal signal swing. As shown in FIG. 3, the lowest value of pull-up impedance will result in the largest voltage input high (Vih) at the receiver. As the pull-up impedance is increased, the Vih will decrease moving closer to VREF+. The lowest value of pull-down impedance will result in the smallest voltage input low (Vil) at the MID receiver. As the pull-down impedance is increased, the Vil will move closer to the VREF− threshold.

Figure 4:
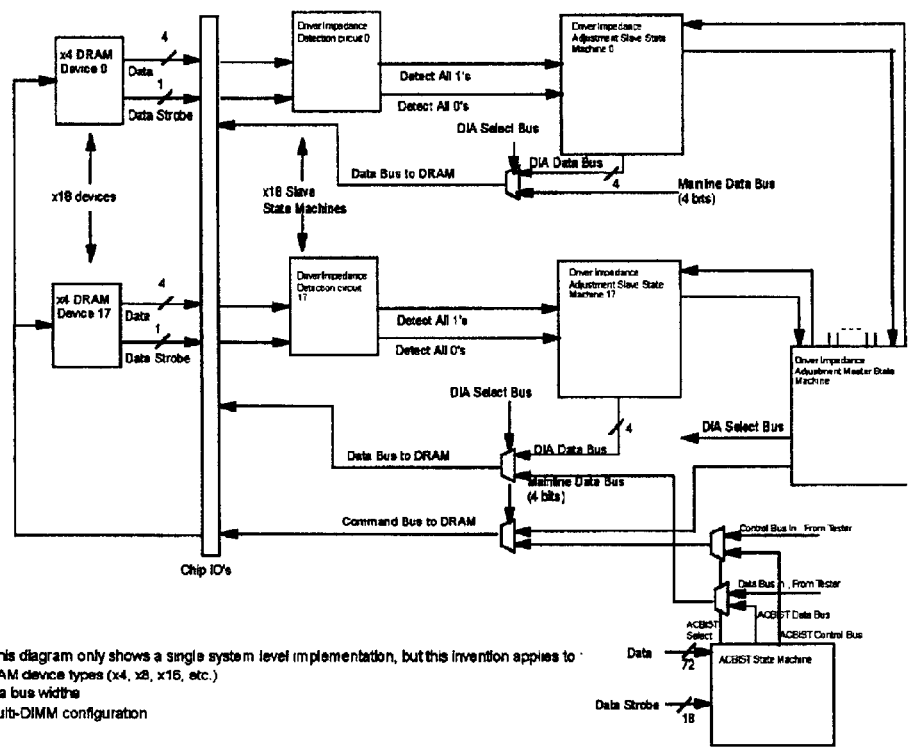
FIG. 4 illustrates the block diagram of the command and data flow used to implement the Driver Impedance Adjustment Control for both DC and AC modes. The x4 DRAM devices in for a 72 bit data bus are shown for illustration purposes. This invention can be applied for any DRAM (x4, x8, etc.) of any data bus width.

FIG. 4 demonstrates what happens at the system level for both DC and AC modes. For DC operation, the ACBIST block can be ignored. In DC mode, the driver impedance master finite state machine (MFSM) will send EMRS OCD commands on a common command bus to the DRAM. There is one driver impedance slave finite state machine (SFSM) per DRAM device on a DIMM so that each DRAM driver impedance setting can be optimized. The SFSM will send data to the DRAM device, and it receives data from the DRAM device. When the SFSM sends data to the DRAM, it is sending commands on the data bus to reset, increment, or decrement the pull-up/pull-down impedance of the DRAM. When the SFSM receives data, it will then send the algorithm exit status (Table 1) information back the MFSM. The MFSM will force the SFSM to set a certain level for either pull-up or pull-down in the DRAM. When the align command is sent to the DRAM, both the data and data strobe respond by driving all ones or zeros. In the pull-up case with VREF set to VREF+, if all the receivers detect all ones from the data and data strobes for a single DRAM device, a signal will be sent back to the SFSM noting that the whole DRAM was detected at one. Each SFSM would then report a pass or fail back the MFSM. For the higher settings of driver impedance, the DRAM will again drive all ones on the bus, but the receiver might not sample all ones due to the fact that some of the DRAM output voltages to do not rise above the threshold of VREF+. At this point, a signal that all ones were not detected at the MID receivers would be sent from a SFSM to the MFSM. This approach is valid for the pull-down as well.

The advantage of having one SFSM per DRAM device is that each DRAM device can be configured independently. This is required because it is possible for two DRAM to have different optimal impedance settings. If there was only a single SFSM for the whole data bus, then the DRAMs would all be configured the same, and be configured for the worst case DRAM. The SFSM will always converge on a final exit status for each DRAM device (refer to Table 1 in the definition of terms). In a multi-DIMM environment, one SFSM can be used for multiple DRAM, as long as each DRAM is in a different rank. As an example, for a 72 bit data bus of x4 DRAM in a 4 rank system, 18 SFSMs would be needed to cover the 72 bit data bus. Each SFSM would support 4 DRAM devices corresponding to the 4 ranks.

Figure 5:
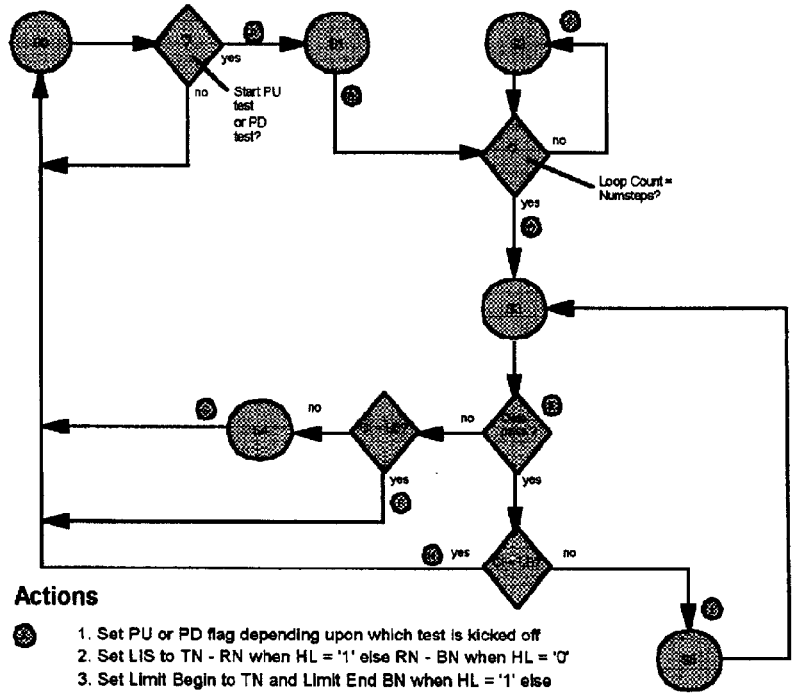
FIG. 5 illustrates the state machine used for the Driver Impedance Adjustment Algorithm.

FIG. 5 shows the algorithm used for finding the optimal driver impedance setting of the DRAM devices in DC mode. After power on reset (POR), the finite state machine (FSM) comes up in the idle state (S0). Prior to starting the FSM, a few programmable settings must be configured. The TOP_NOTCH is the highest setting allowed in the DRAM. BOTTOM_NOTCH is the lowest setting allowed in the DRAM. RESET_NOTCH should be set to the impedance that the DRAM assigns after reset. HIGH_TO_LOW when set to a '1' will start the test from the highest impedance setting and go to the lowest impedance setting, and when set to a '0' will start from the lowest impedance setting and go to the highest setting. (NOTE: the HIGH_TO_LOW bit was added for programmability. Typically this bit would be set to zero, so that the driver impedance will start from the lowest settings therefore maximizing the signal swing. The algorithm assumes that the test will start at a passing setting, and find the failing setting. FIG. 3 shows that the lowest driver impedance settings are needed to maximize signal swing.) The PU_PD flag gets set to a '1' for a pull-up test and a '0' for a pull-down test.

The FSM will remain in the idle state (S0) until a command is received by the MID. The command will start either a pull-up adjustment test, or a pull-down adjustment test. At the transition from the idle state to the reset state (S1), the FSM flag bits are set (A). The flag bits will indicate important settings that affect how the rest of the FSM will run. Based on the initial setup of the TOP_NOTCH, BOTTOM_NOTCH, RESET_NOTCH, and HIGH_TO_LOW, the number of initial adjustment commands (NUMSTEPS) necessary to set the driver impedance to the correct starting value is calculated. Also if HIGH_TO_LOW is a '1' meaning that the FSM will start at the highest impedance setting and count down, the LIMIT_END equals BOTTOM_NOTCH, and the LIMIT_BEGIN equals TOP_NOTCH. If HIGH_TO_LOW is a '0' meaning that the FSM will start at the lowest impedance setting and count up, the LIMIT_END equals TOP_NOTCH, and the LIMIT_BEGIN equals BOTTOM_NOTCH. LIMIT_BEGIN, and LIMIT_END will be used to determine branching conditions in the FSM.

The first action performed by the FSM is to reset the driver impedance of DRAM via the EMRS command at state (S1). From here, the FSM moves into the initial adjustment phase (S2), where the driver impedance is incremented or decremented in a loop until the correct starting driver impedance value for the PU/PD test is set. When the loop is finished, the correct driver impedance for the test to begin is set (D). The FSM now moves to the align state (S3). In the align state, the MID queries the DRAM, and the DRAM will respond by driving the bus to all zeros or all ones. Again, take the pull-up case (the same FSM applies for the pull-down case) and note that at point (E) there is a decision for what to do next. There are four possibilities at this point (E):

A. Datapass is true, and the current impedance is at the LIMIT_END (H). Then the state machine will reset back to idle (S0) and exit with code point "01" from Table 1.
B. Datapass is true, and the current impedance is not at the LIMIT_END (I). Then the state machine will move into the adjustment state (S5) and will increment the current impedance if counting up, or decrement the impedance if counting down. The FSM then moves back to state (S3) where the loop starts over again.
C. Datapass is false, and the current impedance is at the LIMIT_BEGIN (F). This would happen if the first setting of driver impedance yielded a setting where either all ones in the pull-up case or all zeros in the pull-down case was not detected. The FSM will exit the test with code point "00" from Table 1.
D. Datapass is false, and the current impedance is not at the LIMIT_BEGIN setting (G). This would happen if the starting driver impedance value at point (D) is valid (possibility B listed above), and then during a subsequent loop an invalid setting was detected. At this point a pass to fail transition was detected for a driver impedance change and the algorithm would set the driver impedance back to the last known passing setting and exit with code point "11" from Table 1 through (G) back to the idle state (S0).

By running this algorithm for both the pull-up and pull-down impedance settings, a minimal data driver signal swing can be determined for a particular interface in a DC setting. The benefits are less noise on bus, and less power consumed during switching.

In the AC mode, the driver impedance AC algorithm uses the ACBIST engine. The ACBIST engine, is a piece of logic that automatically will write and read a memory space with random data at speeds that maximize the data bus utilization. If the data that is written to or read from an address in memory is corrupted, the ACBIST engine will detect the error, trap the error, and report a miscompare when that address is read. The first step in the algorithm would be to set the driver impedance to the setting found in the DC calibration. The ACBIST would be run, and used to validate the DC calibration. If the ACBIST test fails, the impedance would then be decreased by one for the pull-up/pull-down and the test would be rerun until a passing setting is found.

Our invention has overcome problems created by the introduction of the DDR-II module, summarized below together with a description of a embodiments which we have used. The data strobe receiver circuit of a memory interface which could be used with DDR-I was only required to function as a clock output or input and new DIA capability has been required. To support the DIA capability of the DDR-II module, we modified the data strobe circuitry to also behave in a mode where it was a data receiver input and we provided circuitry to add this special feature to the data strobe circuitry. The problem introduced by the DDR-II product as we discovered was that during DIA, the data strobe cannot perform clocking and two new problems were introduced when we discovered that the data strobes must be latched as data, and the data that used to be clocked by these strobes had to be clocked, but in some different and undetermined manner. We solved both problems regarding data/data strobe sampling by adding an extra sampling L1/L2 latch at the output of the IO circuit. Adding latches is difficult because of the high frequency interface, so we determined that the latch had to be physically close t the boundary scan receiver mux, and the wiring from the IO's receiver pin to the boundary scan mux and DIA sample latch had to be very balanced to minimize the skew across the data and data strobe receiver nets. The latch's output is used to determine the sampled value detected at the IO. Data capture is needed and in our embodiment a solution to the data capture problem involves the use of the boundary scan test circuitry at the IO's. In this implementation the boundary scan receiver latch is used to sample the logic value detected at the IO. This implementation will work for both the data and data strobe pins because each IO has a boundary scan structure required for testability. The boundary scan receiver latch uses a muxed internal core clock to sample the data, rather than its standard test clock. This solution we believe is elegant because it uses a preexisting test structure to sample the data.

Our invention was implemented in an ASIC, which is called BLT, to test the function of the DDR-II Samsung DRAM modules. However, other DDR-II DRAM memory consistent with the JEDEC committee standard is within the scope of the invention. The embodiment we have built includes a detection circuit that tests to determine if the driver impedance setting is valid. If the setting for the driver impedance is not correct, data will not be transmitted properly between the DDR-II DRAM module and the ASIC that interfaces to it. The detection circuit will identify the validity of a driver impedance adjustment (DIA) setting. If the DRAM is in pull-up mode, then the DRAM module will drive back all '1's when queried. If the ASIC receiver does not detect all '1's at the IO device, the detection circuit will register a fail. The pull-down case is the same as the pull-up, except that the DRAM will drive back all '0's when queried and the detection circuit will register a fail if there is not all logic '0's at the IO circuit. The detection circuit solves the problem of knowing whether or not a valid setting is being used. With the BLT, the chip we have built, the driver impedance adjustment (DIA) algorithm solves the problem of finding the optimal driver impedance setting by adjusting the value of the driver impedance through a master ASIC, and then sampling the known value sent back from the DRAM. The state machine will stop when the optimal value of the driver impedance is found. The state machine is used to automate the process of detecting the optimal driver impedance, and configuring the DRAM module accordingly. No longer is it a problem that the test for the driver impedance setting is determined by a DC signal that is driven by the DRAM driver to the IO devices of a master ASIC. We now can account for noise due to switching during the normal AC mode of operation. The algorithm loops through a process in which, for any fixed reference voltage, the DDR-II driver impedance is incrementally altered, and then AC BIST is run to determine whether any faults occur. The first setting at which a fault occurs is considered a failure setting, and the last good setting is taken as the optimal setting. This algorithm is a more robust method of detecting the optimal driver impedance setting because it takes into account AC characteristics of the DRAM, therefore ensuring the setting of the driver impedance will work during normal AC operation. Thus this chip represents our preferred embodiment.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A memory interface device combining memory control circuits and control interface circuits for coupling a DDR SDRAM memory module using DRAM memory formed of a plurality of DDR SDRAMs to data and command processor circuits of a computer system via said memory interface device, comprising:

a memory interface device (MID) including
memory control circuits and control interface circuits for providing a DRAM controller that is used to send commands to the DRAM memory and to drive and receive data from the DRAM memory, and
a driver impedance adjustment engine for exercising a DDR SDRAM conforming to a double data rate standard for a high frequency DDR SDRAM supporting a posted CAS function, on chip driver calibration and on die termination for transmitting and receiving data at a coupled one of said DDR SDRAMs on both rising and falling edges of a clock, said coupled one of said DDR SDRAMs form a part of the memory module coupled to said memory interface device, and
off chip driver calibration circuits, and
data bus and a command bus IO elements for coupling said memory module to said memory interface device, and wherein said off chip driver calibration circuits and said driver impedance adjustment engine are exercisable to find an optimal driver impedance setting for said DRAM memory by adjusting the value of the driver impedance through said memory interface device and then sampling the known value sent back from the DRAM memory, said state machine stopping when the optimal value of the driver impedance is found to automate the process of setting the optimal driver impedance in the DRAM module.

2. The memory interface device according to claim 1 wherein there is a multi-DIMM configuration and in a multi-DIMM configuration each DDR SDRAM memory device of said DRAM memory will have a slave state machine in said memory interface device (MID) that controls the driver impedance adjustment and each of these slave state machines will report to a master state machine to determine if each DRAM has a suitable impedance value.

3. The memory interface device according to claim 1 wherein said off chip driver (OCD) calibration circuits are used to set the driver voltage levels of the DDR SDRAM memory module or of a DIMM of the JEDEC DDR-II standard type for OCD calibration.

4. The memory interface device according to claim 3 wherein said driver impedance adjustment engine includes a state machine and said memory interface module receives a data strobe, not only as a DRAM strobe, but as data input during OCD calibration.

5. The memory interface device according to claim 4 wherein an optimal driver impedance setting of a DDR-II SDRAM memory module is detected in a DC mode.

6. The memory interface device according to claim 5 wherein using AC-BIST the optimal driver impedance setting is adjusted and optimized to account for AC timing influences such as coupled noise, data dependent jitter, and intersymbol interference.

7. The memory interface device according to claim 1 wherein said driver impedance adjustment engine and off chip driver (OCD) calibration circuits are used to adjust the pull-up drive strength and pull-down drive strength of a driver for said DDR SDRAM with the output voltage levels and the rise times optimized around a minimal signal swing that is still immune to noise while not significantly degrading the data eye.

8. The memory interface device according to claim 1 wherein said driver impedance adjustment engine includes a state machine for finding an optimal setting for the DDR SDRAM's driver's impedance using both DC and AC adjustments of the value of the driver's impedance and then sampling the known value sent back from the DRAM memory.

9. The memory interface device according to claim 8 wherein said state machine will stop when the optimal value of the driver's impedance is found for automating the process of detecting the optimal driver impedance and for configuring the memory module accordingly, or will stop when an optimal setting cannot be found but further adjustment is not possible.

* * * * *